(12) United States Patent
Lindenberg et al.

(10) Patent No.: US 7,153,367 B2
(45) Date of Patent: Dec. 26, 2006

(54) DRIVE MECHANISM FOR A VACUUM TREATMENT APPARATUS

(75) Inventors: Ralph Lindenberg, Budingen (DE); Michael Konig, Frankfurt am Main (DE); Uwe Schussler, Aschaffenburg (DE); Stefan Bangert, Steinau (DE)

(73) Assignee: Applied Materials GmbH & Co. KG, Alzenau (DE)

(*) Notice: Subject to any disclaimer, the term of this patent is extended or adjusted under 35 U.S.C. 154(b) by 368 days.

(21) Appl. No.: 10/898,018

(22) Filed: Jul. 23, 2004

(65) Prior Publication Data

US 2005/0263078 A1 Dec. 1, 2005

(30) Foreign Application Priority Data

May 28, 2004 (EP) .................................. 04012663

(51) Int. Cl.
C23C 16/00 (2006.01)
C23C 14/00 (2006.01)
C23F 1/00 (2006.01)
H01L 21/306 (2006.01)
H01L 21/677 (2006.01)

(52) U.S. Cl. ................. 118/719; 118/728; 118/729; 118/730; 156/345.31; 156/345.32; 156/345.51; 156/345.52; 156/345.53; 156/345.54; 156/345.55; 204/298.23; 204/298.25; 204/298.26; 204/298.27; 204/298.28; 414/217

(58) Field of Classification Search ................ 118/728, 118/719; 156/345.51, 345.31, 32; 204/298.23
See application file for complete search history.

(56) References Cited

U.S. PATENT DOCUMENTS

| 4,675,096 | A |   | 6/1987  | Tateishi et al. |
| 5,407,314 | A |   | 4/1995  | Kempf et al. |
| 5,709,785 | A |   | 1/1998  | LeBlanc, III et al. |
| 5,993,556 | A | * | 11/1999 | Maidhof et al. ............ 118/719 |

FOREIGN PATENT DOCUMENTS

| EP | 0 136 562 A | 4/1985 |
| JP | 06-322542 A | 11/1994 |
| JP | 2002-200419 A | 7/2002 |

OTHER PUBLICATIONS

Patent Abstracts of Japan, Nov. 6, 2002.
Patent Abstracts of Japan, Mar. 31, 1995.

* cited by examiner

Primary Examiner—Parviz Hassanzadeh
Assistant Examiner—Rakesh Dhingra
(74) Attorney, Agent, or Firm—Fulbright & Jaworski L.L.P.

(57) ABSTRACT

The invention relates to a drive mechanism for a vacuum treatment apparatus by which substrate holders can be transported around an axis (A—A) from an entrance airlock to an exit airlock. A stationary supporting column (1) is disposed in the center and on it a rotatory drive chamber (6) is borne which has control rods (9) for a rotation and a radial displacement of the substrate holders. In the rotatory drive chamber (6), a motor (4) and rotatory displacement drives for the control rods (9) are arranged on the supporting column (1), the control rods being in active connection each with a corresponding substrate holder. To solve the problem of carrying substrates through the vacuum treatment apparatus, even substrates of great area, smoothly, at a slight angle to the vertical, not fastened to the substrate holders, it is provided that a) the motor (4) is joined to a stationary bearing carrier (5) in which a rotatory star-shaped array of cantilevers (14) is mounted, b) the cantilevers (14) are articulated at one end to bell-crank levers (16), each of which has a pivot pin (17), c) the other end of each of the bell-crank levers (16) is articulated to one of the control rods (9), and that d) the pivot pins (17) of the bell-crank levers (16) are guided in a first stationary radial cam (11) whose shape determines the radial movements of the control rods (9). A periodic, variable superposition of the radial movements is performed by variable tangential movements produced by a second stationary radial cam (12) with a bell-crank lever which is joined by a link (24) to the drive chamber (6).

18 Claims, 7 Drawing Sheets

DRIVE MECHANISM FOR A VACUUM TREATMENT APPARATUS

Figure 1:
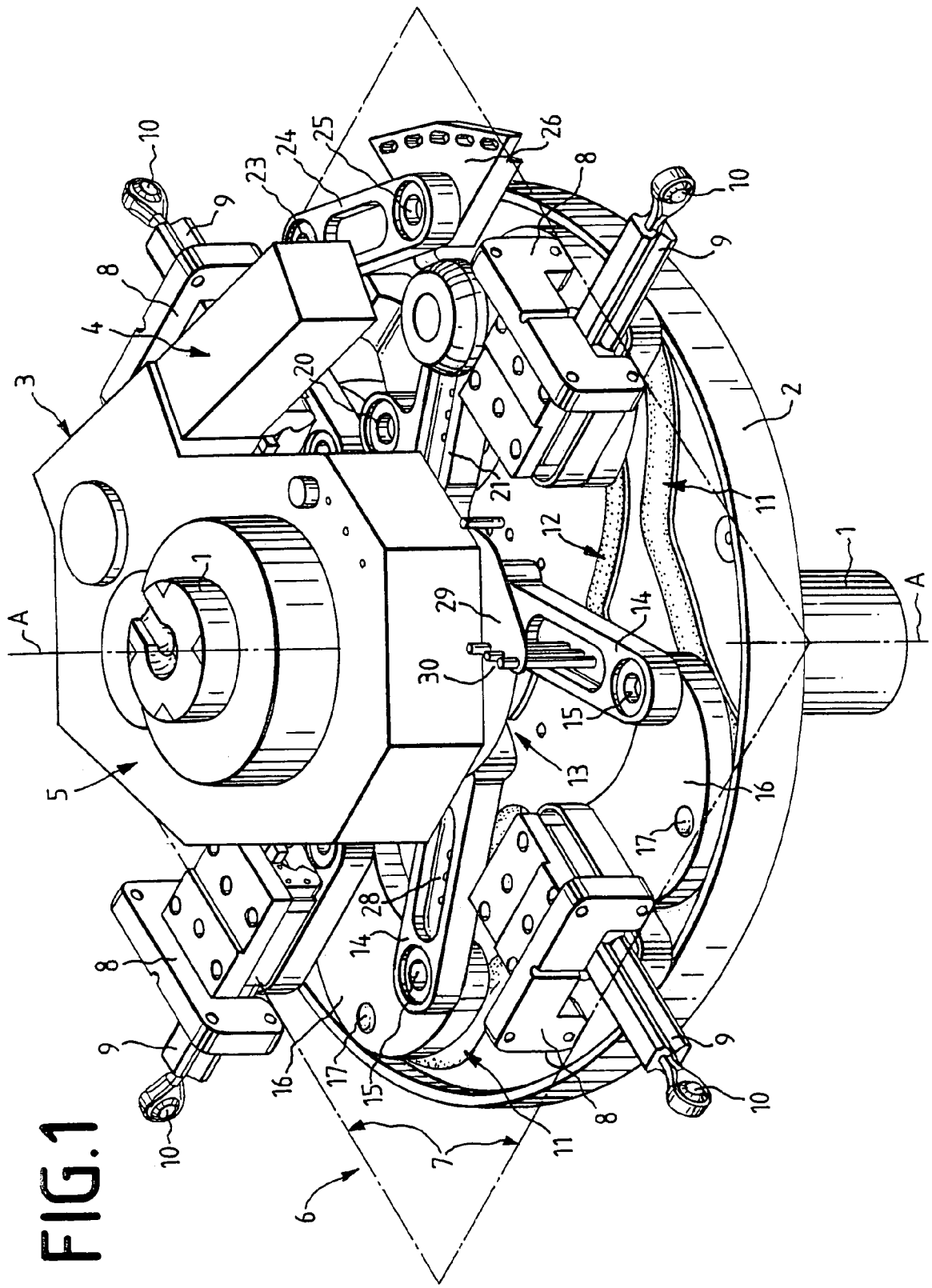

This application claims priority from European Patent Application No: 04 012 663.3 filed May 28, 2004, which is hereby incorporated by reference in its entirety.

The invention relates to a drive mechanism for a vacuum treatment apparatus, by which a plurality of substrate holders can be transported on a circulatory path about an axis from an entry airlock through at least one treatment chamber to an exit airlock, a stationary supporting column being disposed in the center of the circulatory path, on which a rotatory drive chamber is borne, on the outer sides of which control rods are disposed for rotation and radial displacement of the substrate holders; a stationary motor is fastened on the supporting column in the rotatory drive chamber, and rotatory displacement drives for the control rods are disposed, each of which passes through one of the walls of the drive chamber and is in active connection with a corresponding substrate holder.

Such an apparatus serves preferably, but not exclusively, for planar rectangular or square substrates in an at least substantially vertical position, containing a vacuum chamber with at least two treatment chambers distributed evenly on the periphery of the vacuum chamber and open on the chamber side, an entry airlock, an exit airlock and a rotatory arrangement of substrate holders within the vacuum chamber with a drive mechanism for the sequential rotation and the advancement and withdrawal of the substrate holders relative to the treatment chambers.

Continuously working treatment or coating apparatus which are operated under vacuum to the limit of the power of the vacuum pump units, and in which different treatments are performed on so-called substrates at individual treatment stations, contain as a rule the following units:

a) at least one vacuum chamber b) at least one vacuum system or pumping system c) treatment stations with treatment sources accessible from the vacuum chamber d) in some cases interior airlock valves at the entry of the treatment stations e) supply systems for the treatment sources (electric power and/or gas sources)

f) at least one airlock system with lock valves for letting the substrates pass in and out of the vacuum chamber g) transport systems for bidimensional or multidimensional transport of the substrates h) substrate holders or carriers in cooperation with the transport systems, and i) in some cases input units for the preparation and/or the removal of the substrates ahead of the airlock system of the apparatus.

Insofar as apparatus with rotatory and in some cases radial transport paths and treatment stations or chambers connected to at least one, at least substantially rotationally symmetric main vacuum chambers are concerned, such apparatus are also called "cluster apparatus."

The treatment processes used are preheating (outgassing) and cooling of the substrates, vacuum vapor depositing, cathode sputtering, plasma treatment (e.g., glowing for cleaning and preparing for adhesion), the PVD process, the CVD process and the PCVD process, for which numerous process parameters and apparatus components are known. Herein, "P" stands for "physical," "C" for "chemical," "V" for "vacuum" and "D" for "deposition." A number of these processes, whose names have established themselves in international parlance, can be performed reactively (with the input of reaction gases or gas mixtures) or non-reactively (in the presence of inert gases). Also, etching processes for surface treatment include the production of certain "surface patterns" and contact lines on the substrates. All process steps and components of apparatus are also involved, depending on the requirements to be made of the end products, are concerned in the subject matter of the invention.

In the historical development, first the continuous "cluster apparatus" are used for relatively small substrates such as diskettes, chips, memories and wafers. However, considerable problems are faced in their further development in connection with larger substrates such as window panes and displays, such as the dimensions of the apparatus, the space required for handling the substrates and in some cases the substrate holders, e.g., raising to a substantially vertical position substrates presented in a horizontal position, the danger of elastic deformation, breakage and/or mechanical damage to the substrates and/or their coatings, and contamination, especially due to the accumulation of coatings on components that are present in the apparatus temporarily or for long periods, and the spalling off of these impurities by various process parameters, especially temperature fluctuations or mechanical effects.

Thus, according to EP 0 136 562 B1, to be discussed below, each substrate is delivered lying flat to an airlock system, first lifted upward therein with a lifting device, and then turned by a turning device to a vertical position in which it is fastened to a substrate holder. When it exits in a second airlock system the order of these steps is then reversed. In the case of rectangular substrates of large area this would lead to considerable space problems, large-capacity airlocks and chambers, as well as long evacuation periods and/or high-capacity evacuation pumps.

European Patent EP 0 136 562 B1 has disclosed a continuous cathode sputtering apparatus for small circular substrates such as diskettes, semiconductors and wafers. The outer chamber is provided equidistantly on the circumference with an airlock apparatus and four chamber-like treatment stations. Apparatus such as these also belong to the "cluster apparatus."

Between and outer and an inner chamber a polygonal pot is mounted for rotation, and on its frame five substrate holders are arranged by means of leaf springs which when in the active position close the airlock apparatus by means of gaskets and a valve function. The radial movements of the substrate holders, which remain always in the vacuum chamber, are produced synchronously only in the stationary state by a central cone and five push rods which are carried in the frame of the inside chamber and are brought through its wall at about half-height, and consequently cannot rotate with it. Also stationary is the drive with its cone.

The substrate holder pot is rotated step-by-step by an additional drive. To be able to rotate the substrate holder pot within the vacuum chamber from station to station, the said push rods must be retracted cyclically out of the circular or cylindrical path of movement of the substrate holder pot and then thrust forward again. About the harmonization and adaptation of the tangential and radial speed curves by the drive mechanism, nothing is stated or indicated, on account of the small size of the substrates if for no other reason.

Due to the constant increase in substrate dimensions and the reduction of stiffness and strength because of the reduction of substrate thickness as development advances, new problems have arisen which have led to very complex and expensive principles of construction and complicated procedures.

The invention is addressed to the problem of improving a drive mechanism of the kind described in the beginning to the effect that substrates even of great area, standing at a slight angle to the vertical and not fastened to the substrate holders, can be carried largely smoothly through a vacuum treatment apparatus and treated.

As a result of additional developments of the invention, principles of construction and operations are given consideration, which lead to an additional reduction of the floor area, chamber capacities, evacuation time and a further simplification of the handling of the substrates outside and inside of the vacuum chamber, and nevertheless especially to a definite reduction of the danger of contamination of the substrates by particles from coatings that spall off.

The solution of the stated problem is obtained according to the invention, in the drive mechanism described in the beginning, by the features of the specific part of claim 1, namely that a) the motor is affixed to a stationary bearing case in which a rotatable star-shaped arrangement of cantilevers is journaled concentric with the supporting column, b) the cantilevers are pin-jointed at one end to bell-crank levers which have at least one pivot pin, c) the other ends of the bell-crank levers are pin-jointed each to one of the control rods, and d) the pivot pins of the bell-crank levers are guided in a stationary control groove whose shape determines the radial movements of the control rods.

By this solution the stated problem is solved satisfactorily to the full extent, and especially principles of construction of the drive mechanism are given which lead to harmonious and smooth movements of the substrate holders on their paths of movement which are continuous within the periphery.

As a result of further developments of the invention, it is especially advantageous whenever either individually or in combination:

the control rods are carried in radial guides which are fastened to the rotatable drive chamber.

the first control groove is situated in a stationary control plate underneath the bell-crank levers, the bell-crank levers are sickle-shaped and are curved and arranged radially outward, and their pivot pins, which are guided by the first control groove, are disposed in the center area of the bell-crank levers, the ends of the bell-crank levers turned away from the cantilevers are joined to the control rods through connecting rods, the first radial cam in the circumferential direction has a continuous periodical undulate shape, by whose maximum radial distance from the axis the end position can be determined with regard to the particular treatment chamber.

within the first stationary radial cam a second stationary radial cam is disposed; that furthermore on the rotatable star-shaped arrangement of cantilevers at least one swivel joint is disposed, on which a bell-crank lever is provided whose one end is guided by the second radial cam and whose other end is connected by a link to the drive chamber, such that its circumferential speed is periodically variable, superimposed upon the radial displacement of the substrate holders, on each of the diametrically opposite points on the star-shaped array of cantilevers there is a swivel joint, each with a bell-crank lever which is joined in each case by a link to the drive chamber, the end of the link remote from the at least bell-crank lever is joined by a pivot pin to the drive chamber, the pivot pin is joined by an angle piece and a counterpiece to an adjacent corner of the drive chamber, to each of the rotatable cantilevers there is at least one position transmitter which is in active connection with corresponding stationary position receivers, the angular position of all cantilevers as well as their association with one of the treatment chambers as well as with the transfer chamber can be determined by signals from the position transmitters and position receivers, four cantilevers, one transfer chamber and three treatment chambers are arranged on the periphery of the axis with an equidistant angular distribution, the drive mechanism is disposed with the drive chamber between the bottom of an interior chamber part and the bottom of an outer chamber part, four pairs of horizontal cantilevers are fastened to the drive chamber in a crosswise arrangement and on them parallelogram linking means are suspended whose bottom ends are joined by additional horizontal cantilevers to the substrate holders, the substrate holders are aligned upward toward the axis at angles of 3 to 15 degrees, and/or if a horizontal linear row of airlocks is arranged in a direction tangential to the axis on the chamber part and consists of the entrance airlock, the transfer chamber and the exit airlock through which the substrates can be guided at an angle of 3 to 15 degrees.

An embodiment of the subject matter of the invention and its manner of operation and advantages are further explained below with the aid of FIGS. 1 to 7. It is emphasized that the invention is not limited to a four-chamber principle with a transfer chamber and three treatment chambers, and that the total number of chambers including the airlock chambers and the drive mechanism with its angular positions can be varied upward and downward depending on the product specification.

Figure 2:
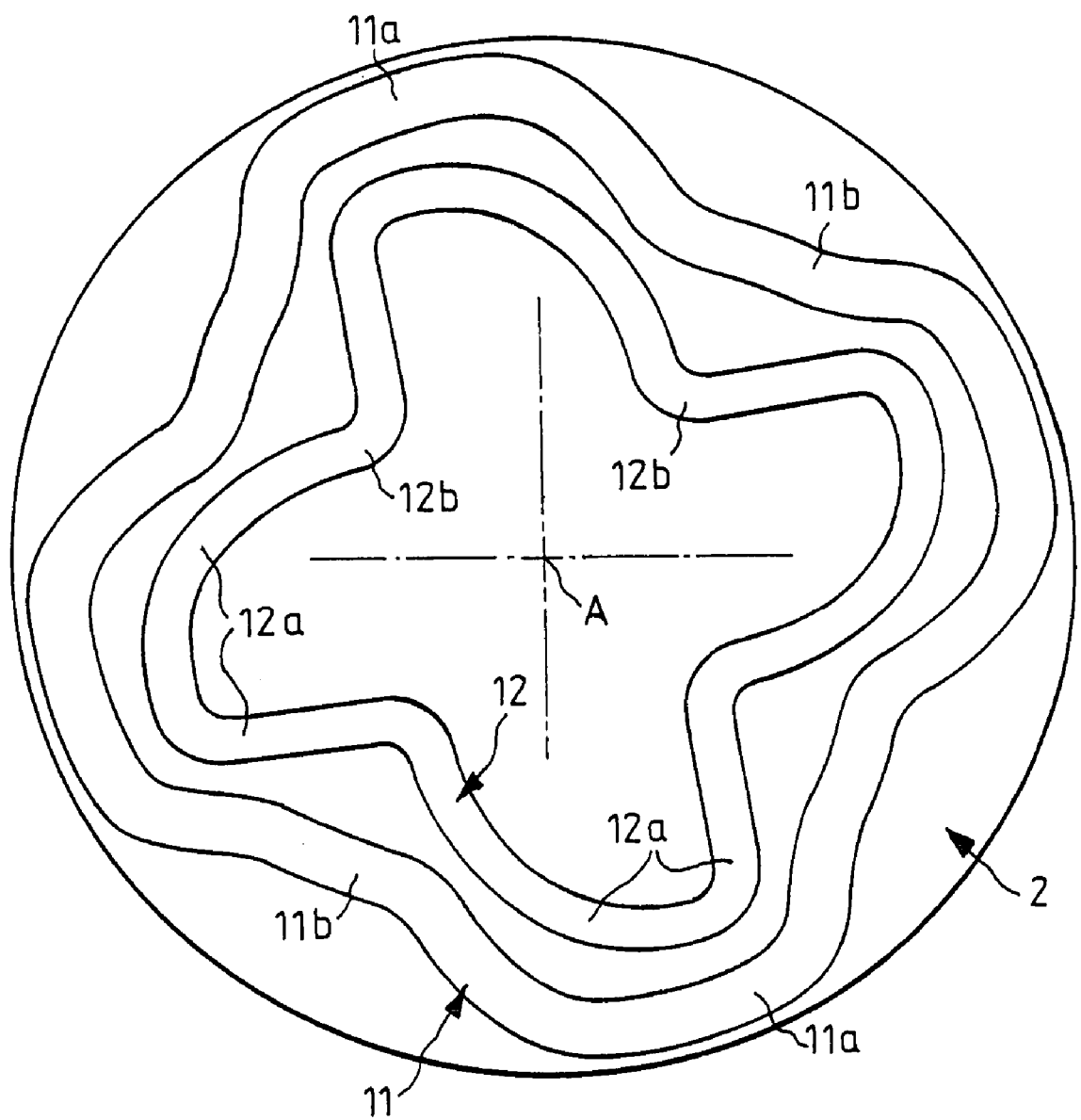
Figure 3:
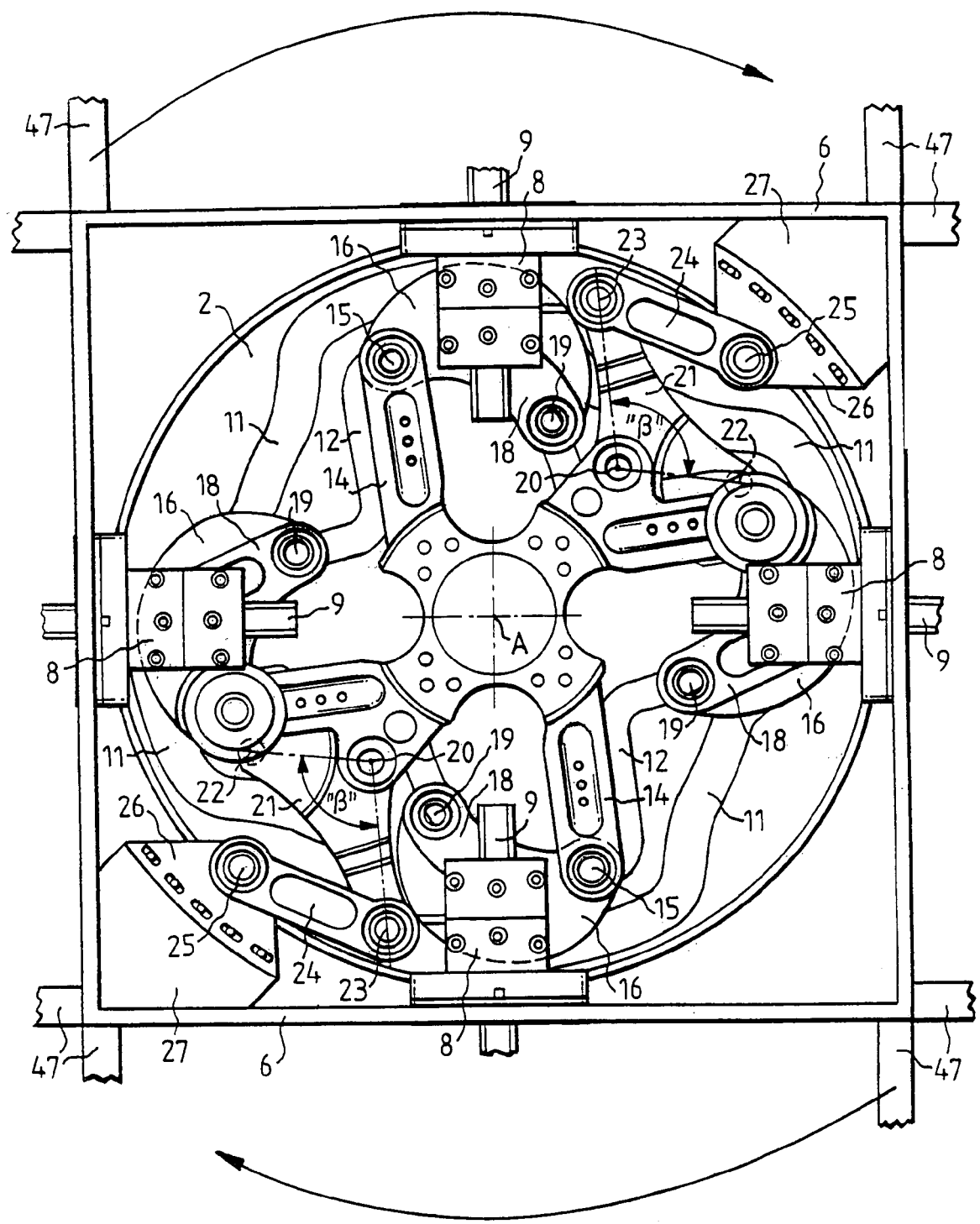
Figure 4:
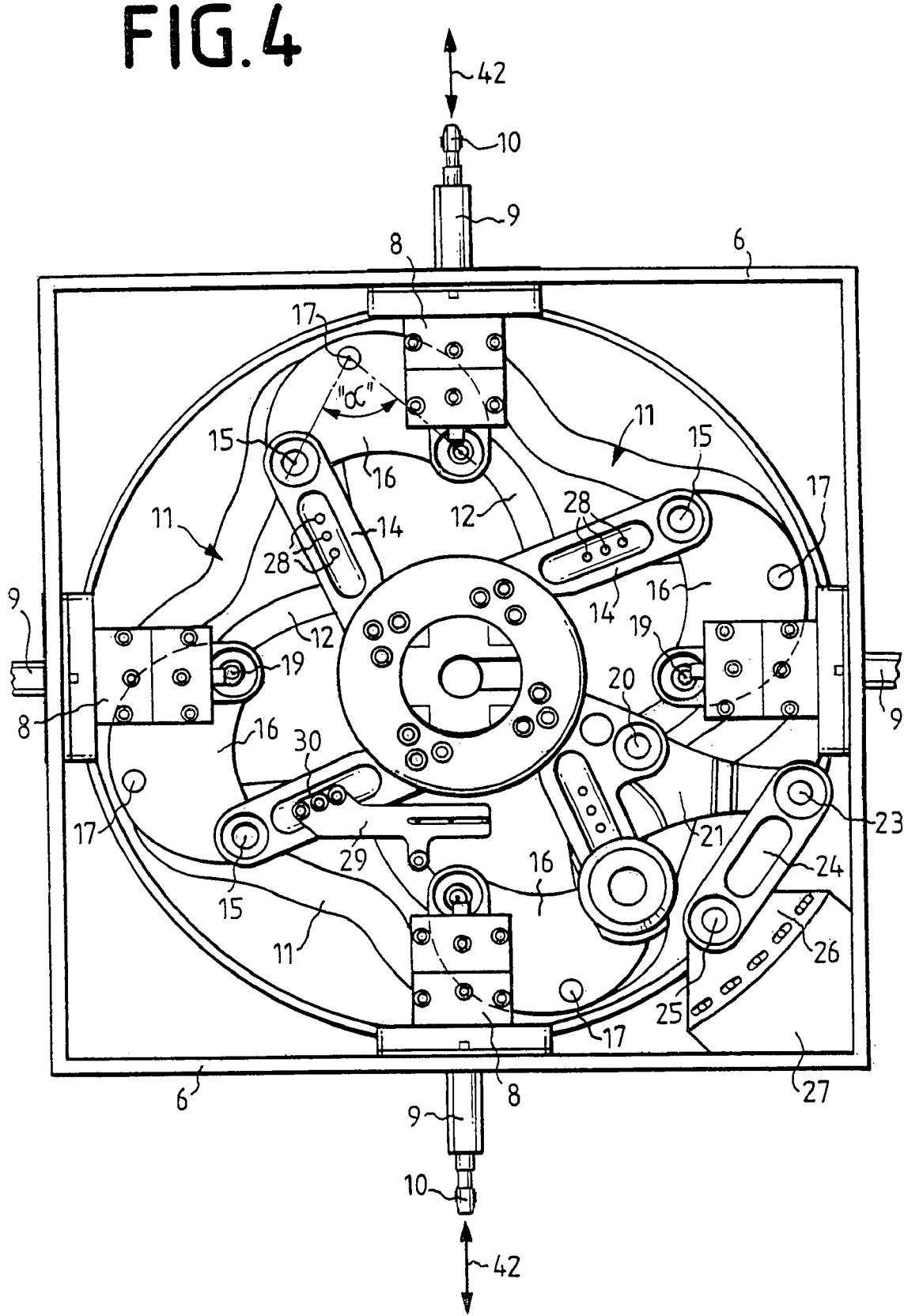

FIG. 1 is a perspective drawing of the internal drive mechanism without the housing of the drive chamber and without substrate holders, FIG. 2 a top plan view of the stationary control plate with its two radial cams, FIG. 3 a top plan view of the drive mechanism after removal of the drive unit with motor and bearing housing, FIG. 4 a top plan view similar to FIG. 3 with the drive chamber in a position turned 90 degrees.

Figure 5:
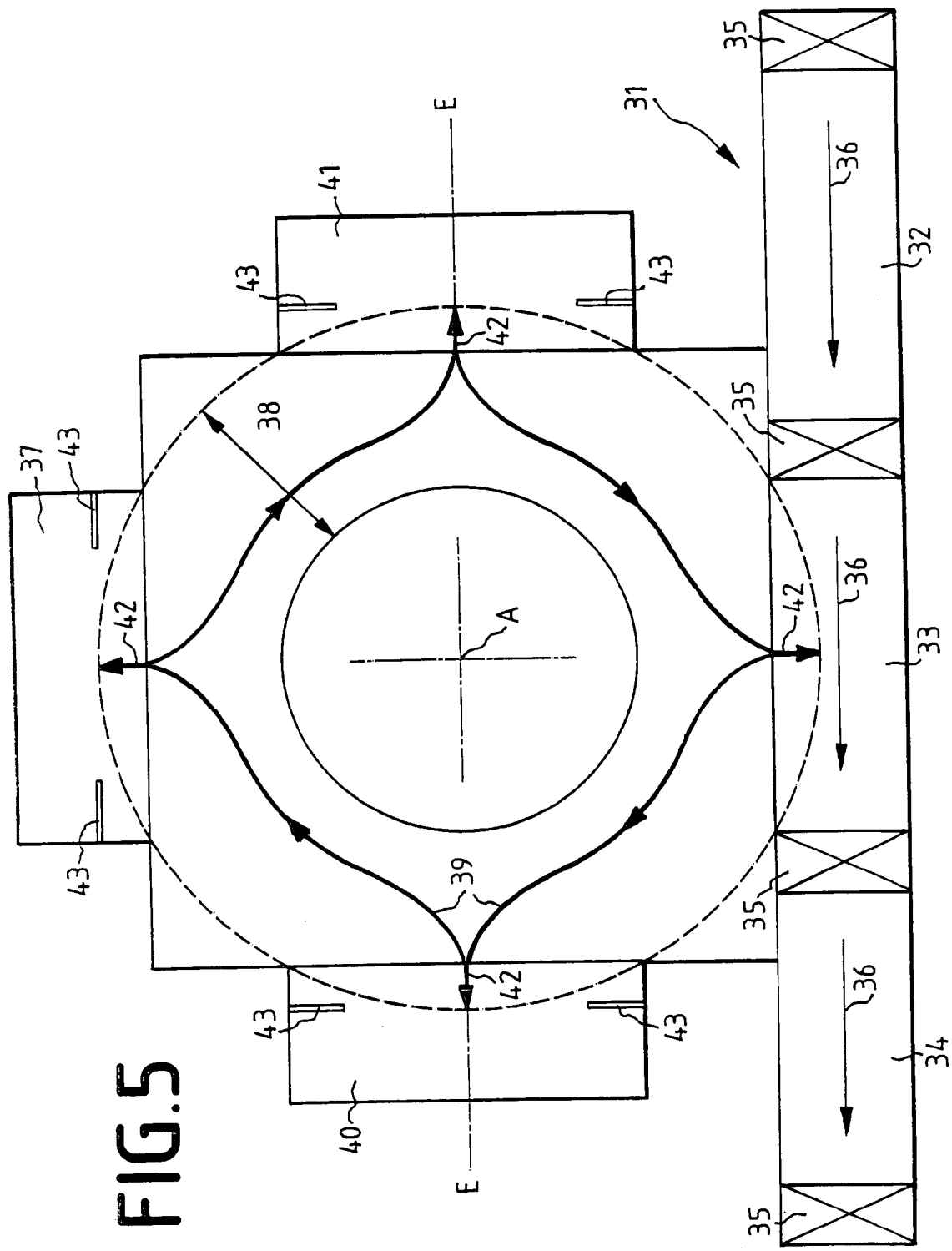
Figure 6:
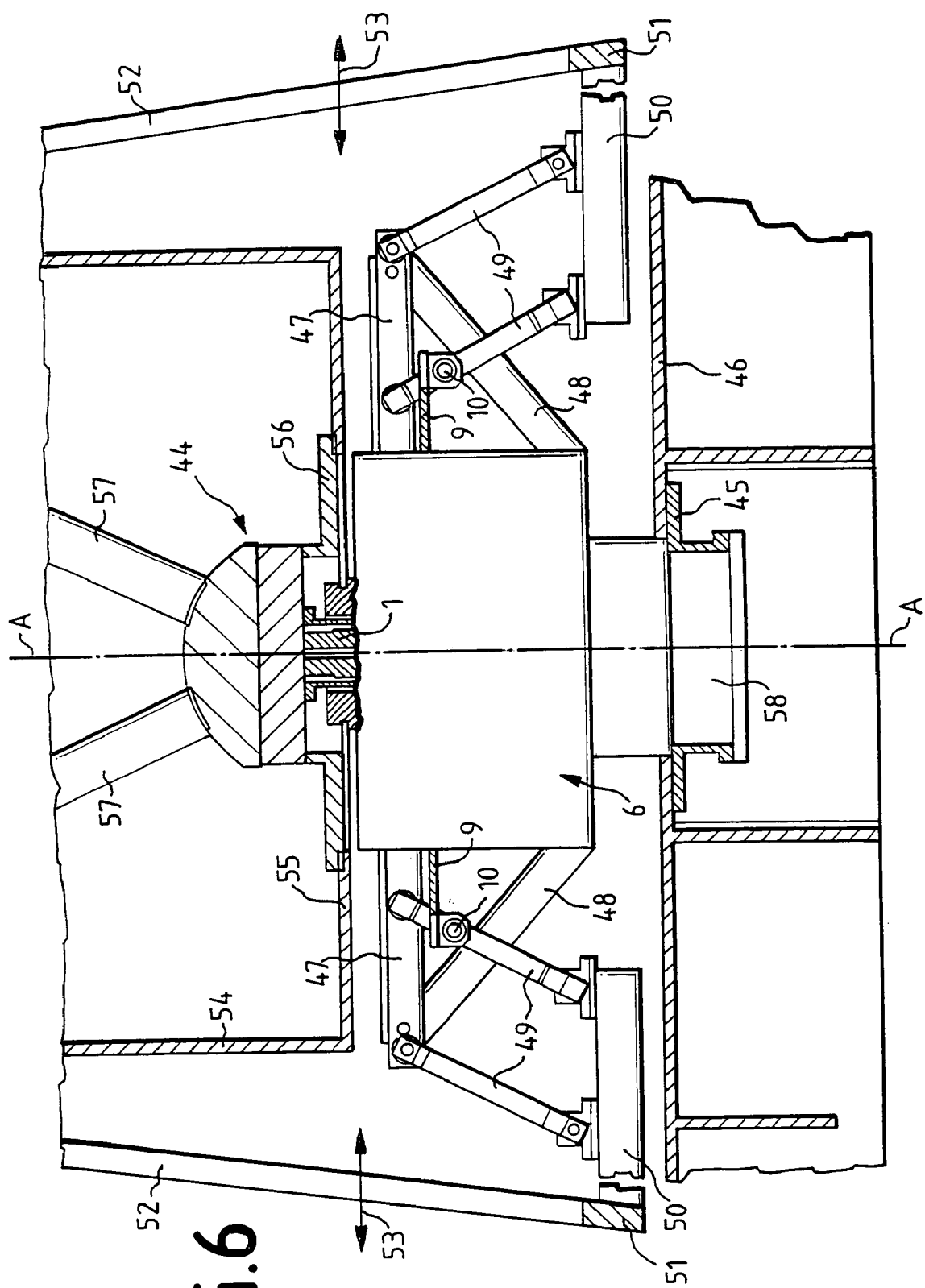
Figure 7:
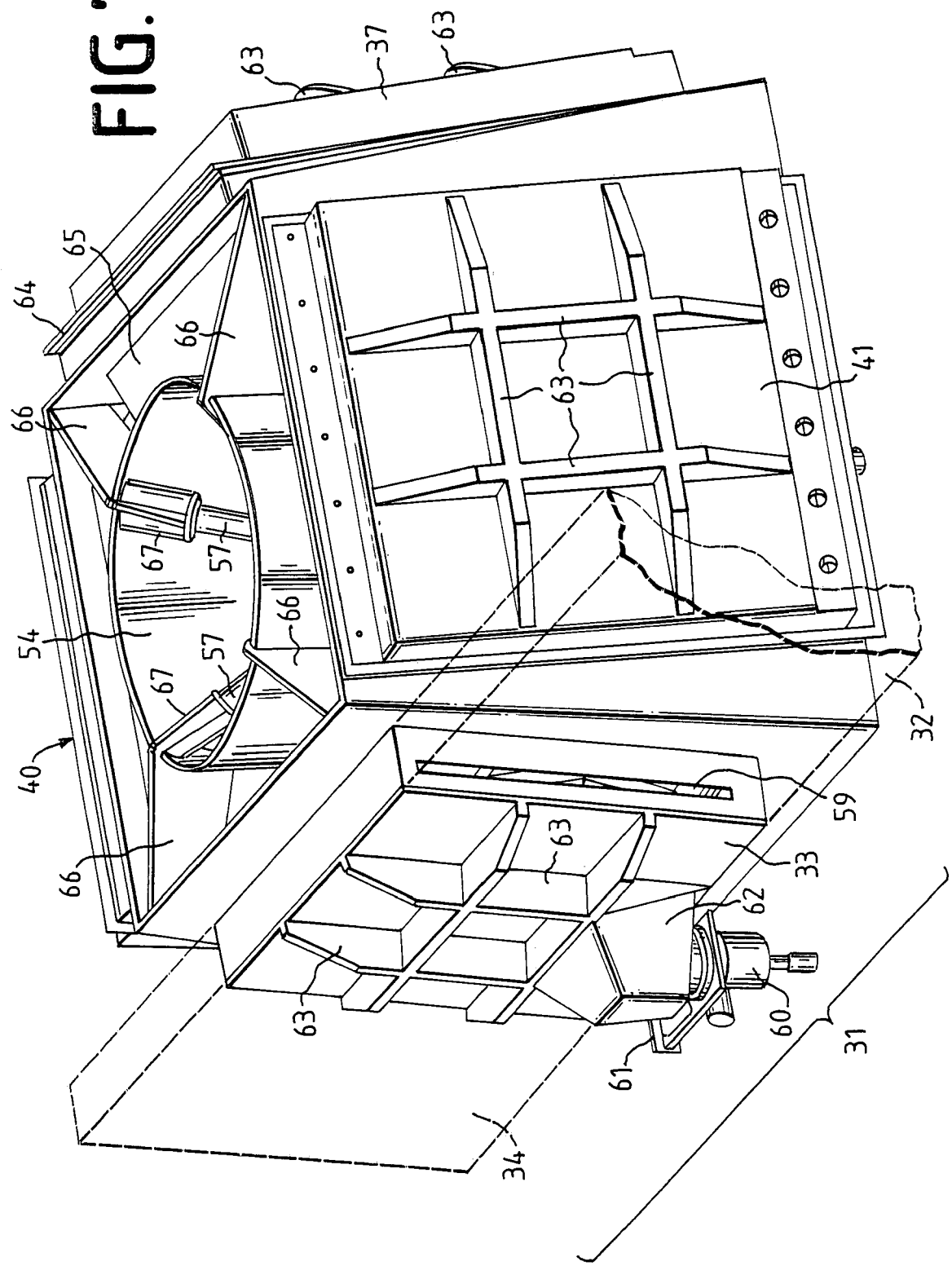

FIG. 5 a schematic representation of the superimposed movements within a vacuum apparatus in the circumferential direction and in radial directions, FIG. 6 a side view, partially sectioned axially, of the core of a vacuum apparatus of FIG. 5 with the drive chamber and two substrate holders suspended thereon and shifted outwardly, and FIG. 7 a perspective external view of a complete apparatus for the use of means according to FIGS. 1 to 6.

In FIG. 1, a non-rotating supporting column 1 with an axis A—A is represented, about which a system of four substrate holders described further below can be rotated. On this support post 1 a discoidal radial cam plate 2, likewise non-rotating, is fastened, and, spaced above it, a drive unit 3 with a motor 4 and a bearing housing 5. In the space between the radial cam plate 2 and the bearing housing 5 there is a complex system of control elements which will be further described below, and which is rotatable as a whole about the axis A—A.

The entire system of control elements and drive unit 3 is surrounded by a drive chamber 6 of square plan, not shown here in detail, which can rotate about the axis A—A, the innermost circumferential edge is indicated by a dash-dotted line 7. At the four lateral walls of the rotatable drive chamber 6, four radial guides 8 are fastened with equidistant angular distribution, each with a control rod 9 movable radially to the axis A—A, which bear at their outer ends pivots 10 for the control of substrate holders described further below.

The control plate 2 bears, shown here only partially, two continuous radial cams milled within its perimeter, namely a first, outer radial cam 11 and a second, inner radial cam 12, whose courses are shown completely in FIG. 2, also in relation to one another.

Directly beneath the stationary bearing housing 5 a rotatable cross 13 is borne therein, having four cantilevers 14 set equally apart, of which only two are visible in FIG. 1. They engage with their outer ends by means of pivot bearings 15 one end of each of four bell-crank levers 16, and their other ends, not visible here, are in working connection with the control rods 9, as will be further described later.

In their middle portion the bell-crank levers 16 are engaged with pivot pins 17 and guide rolls underneath the bell-crank levers 16 in the outer radial cam 11. The bell-crank levers 16 are shown here with a sickle shape. Determinative, however, is the angular position of two virtual straight lines in each case, which run from the pivot bearing 15 to the pivot pin 17 on the one hand, and from the latter to the point of articulation with the corresponding control rod on the other. The angle "α" with the apex in the axis of the pivot pin 17 can be between 60 and 120 degrees (see FIG. 4, top).

Just in FIG. 2 it becomes evident that, due to the gradual transitions between the relatively outer radial cam sections 11a and the relatively inner radial cam sections 11b, smooth radial movements of the control rods 9 are made possible.

In FIG. 3, wherein part of the control cam elements is omitted, it is also evident that the bell-crank levers 16 are joined to the control rods 9 at the ends remote from the cantilevers 14 through a connecting rod 18 and a first joint 19. The second joint is concealed by the cover plates of the radial guides 8, which are open at the bottom for this purpose, as it is shown in FIG. 1.

Since now the control of the radial movements by the relative motion between the outer radial cam 11 of the control plate 2 and the rotating control rods 9 has been described, it will now be explained how the control of the superposed periodically variable rotatory speed of the control rods 9 by the rotatory relative movement between the inner radial cam 12 in control plate 2 and the rotating control rods 9 operates.

As it likewise appears from FIG. 3, two diametrically opposite swivel joints 20 are placed on the rotary cross 13 with the cantilevers 14 situated thereon and an additional bell-crank lever 21 can turn to a limited degree on each. The bell-crank levers 21 have each two pivot pins 22 and 23 of which the first ones are partially concealed and are guided by a roller not shown (concealed) in the inner radial cam 12. The angular positions of the pivot pins 22 and 23 relative to the swivel joint 20 have the angle "β" which is represented in FIG. 3, upper right and lower left. This angle can be chosen between 60 and 120 degrees depending on space conditions and movements. Due to the diametrical arrangement of two bell-crank levers 21, inevitably occurring radial forces are compensated, yet it is basically possible to make do with only one of the bell-crank levers 21.

It is also clear from FIG. 2 that, due to the gradual or harmonic transitions between the relatively outer radial cam sections 12a and the relatively inner radial cam sections 12b, smooth radial movements of the pivot pins 22 are made possible. The circumferential speed of the gear chamber 6 in the direction of the two outside arrows depends on these radial movements, according to the lever lengths and the angular position of the pivot pins 22 and 23 relative to the pivot pin 20.

The pivot pins 23 are joined each by a link 24 and an additional pivot pin 25 to one corner piece 26 which is fastened, and to a limited extent adjustable, to each corner block 27 which is joined to the drive chamber 6 in two diametrically opposite corners. Thus the circumferential speed of the drive chamber 6 is varied gradually and periodically between maximum levels and stand-still, depending on the shape of the inner radial cam 12. Stand-still occurs whenever the control rods 9 are either exactly in front of the receiving chamber for the substrates or exactly in front of one of the treatment chambers.

FIG. 4 shows, carrying forward the reference numbers, components of the controlling drive after dismounting the drive unit 3 with the motor 4 and the bearing housing 5. It can be seen that the controlling drive has advanced the gear chamber 6 by an angle of 90 degrees clockwise, shown by the position of the pivot pin 25, corner piece 16 and block 27 in the lower right corner. This movement is followed by the rotary cross 13, the pivot pin 20, the bell-crank lever 21 and all radial guides 8 with the control rods 9. For the sake of clarity, one of the bell-crank levers 21 in FIG. 3 with its connecting elements has been omitted; it would then have to be in the upper left.

FIGS. 1 and 4 also show the following. Three position transmitters 28 are disposed on the cantilevers 14 and on the bearing housing 5, which is not shown here, and thus three position receivers 30 are fastened on one cantilever 29 in a coaxial complementary coverage possibility, with which it has the following relationship: by corresponding data transmission and evaluation it is possible not only to determine the position of the cantilevers 14 and the control rods 9 with respect to the treatment chambers and the transfer chambers within the airlock series, but also to know which control rod 9 is opposite which chamber.

FIG. 5 shows a schematic representation of the composite movements in the circumferential direction and in the radial direction. Parallel to the section line E—E is a row 31 of airlocks consisting of an entry airlock 32 of a transfer chamber 33 and an exit airlock 34. The airlock row 31 contains vacuum valves 35 of a known kind.

The linear direction of the step-wise transport of the substrates standing at an angle, or of substrates carried without substrate holders, through the airlock row 31 is indicated by the series of arrows 36. A treatment chamber 37 lies opposite the transfer chamber 33. Inside of an annular space 38 the harmonic or gradual sequences of movement are indicated by heavy arrow lines. The rotatory movement takes place, starting from the transfer chamber 33, by 90 degrees each time along the continuous arrow line 39. At the four stopping points directly in front of the transfer chamber 33 and the treatment chambers 40, 37 and 41 the advancement and withdrawal of the substrates are indicated by radial arrows 42. The advancement of the substrates is performed up to immediately in front of shielding frame-like apertures 43 which are disposed in the opening areas of the treatment chambers 40, 37 and 41. Sealing action between the substrates and these apertures 40 is not necessary, however, for the reason that the extremely thin substrates cannot or need not make any contribution thereto. As soon as the rearward movements of the substrate holders are completed, the latter are rotated by 90 degrees in front of the next-following treatment chamber, at the end of the treatment in front of the transfer chamber 33, for further transport into the exit airlock 34.

The extremely compact, space and bulk saving structure of the apparatus can be seen in FIG. 5, especially the fact that the substrate holders do not have to be airlocked out into the atmosphere. In all cases, even perforated substrate holders in the airlock chambers 32 and 34 are arranged with a supply of compressed gas over the entire substrate surface and rollers are disposed at the bottom end, so that the substrates can be pushed up without friction on gas cushions onto the substrate holders and removed from them again. For evacuation, and while the substrates are standing still on their holders, the gas supplies are momentarily shut off. This also applies to the period in which the substrates are on their substrate holders 52 in the annular space 38.

In FIG. 6 a central driving mechanism 44 is shown, having a vertical axis A—A, a coaxial mounting flange 45 and the gear chamber 6, in which the system according to FIGS. 1 to 4 is arranged. The mounting flange 45 serves for fastening to a bottom 46, only partially shown, of the vacuum chamber. To the corners of the rotatable gear chamber 6 a total of eight cantilevers 47 are fastened, which thrust with props 48 against the gear chamber 6 (see also FIG. 3 in this regard).

At the cantilevers 47, which are parallel to one another in pairs and form a right-angle cross, a total of eight parallelogram links 49 hang down from upper pivots. The bottom ends of the parallelogram link arrangements 49 are mounted on horizontal cantilevers 50 in the form of U-shaped hangers with legs parallel to one another, whose outwardly pointing ends are connected each by a horizontal crosspiece 51 of a frame-like substrate holder 52, and serve for substrates not shown here. At the top the substrate holders 52 are aligned rearward at an angle between 3 and 15 degrees from the perpendicular.

The two substrate holders 52 shown can therefore move opposite one another in the direction of the arrows 53 and can move substantially radially toward one another. It is to be emphasized that only two of the substrate holders 52 are shown. The other two substrate holders, which are situated in front of and in back of the gear chamber 6, are not shown for the sake of ease in viewing. They are likewise movable radially in opposite directions, and at right angles to the two arrows 53.

The gear chamber 6 is integrated into a vacuum chamber with the vertical axis A—A. This vacuum chamber consists of an inner, pot-shaped chamber portion 54 with a bottom 55 into which the upper end portion of the supporting column 1 is inserted so as to be unable to rotate and is made vacuum-tight by means of a flange 56. Vertical support is provided by anchor bars 57 whose effective length is variable by means of adjusters 67 shown in FIG. 7. Of these only two of these anchor bars 57 are shown which lie in back of the vertical section plane (E—E in FIG. 5) and are suspended according to FIG. 7 on radial gusset plates 66.

The vacuum chamber furthermore has an outer chamber part 64 (see FIG. 7) in the form of a four-cornered truncated pyramid with the bottom 46 through which a lower prolongation 58 of the gear chamber 6 is brought in a vacuum-tight but rotatable manner.

Between the horizontal bottoms 46 and 55 are the important rotatable parts of the drive mechanism 44. The rotatable substrate holders 52 reach upward from below into the annular chamber 38 (see FIG. 5) and are displaceable with radial components of movement. Slide-through passages through the cylindrical wall of the inner chamber portion 54 are not present. The displacements of the substrate holders 52 take place instead through the previously described parallelogram link systems 49 in which the position of the rocker pivot results from the definition, "parallelogram-link systems." What takes place, therefore, is a symmetrical rotation about a center position. By making the length of the links sufficient for a predetermined size of the pivot angle or radial component of movement, it can be brought about that the vertical component of movement is as small as possible.

In contrast to slide-through passages, such rocker pivots produce virtually no wear and tear nor any dust of coating materials which might affect the quality of coatings on the substrates. Furthermore, the point of application (or engagement) at the cantilever 50 on the substrate holders 52 takes place at their bottom edges, not in the center of the substrate as in the subject matter of EP 0 136 562 B1. The bottom pivots of the previously described parallelogram link arrangements 49 lie only with the least possible space above the upper sides of the cantilevers 50 and on the backs of the substrate holders 52, so that any wear debris is unable even for this reason to reach the outsides of the substrates.

It is furthermore apparent from FIG. 6 that the outer ends of the horizontal control rods 9 for the cyclic movements of the previously described parallelogram link arrangements 49 protrude from the gear chamber 6 and engage the inner links at the pivots 10.

FIG. 7 now shows, carrying forward the same reference numbers, a perspective exterior view of a complete apparatus for the use of means according to FIGS. 1 to 6. The entry airlock 32 and exit airlock 34 are indicated in broken lines on both sides of the transfer chamber 33. The sloping entry slot 59 of the transfer chamber 33 is shown, and likewise a pump connection 60 attached to it, with a shut-off slide valve 61 and a vacuum cryopump 62. Clearly visible is the ribbing 63 of the transfer chamber 33 and treatment chamber 41 to withstand the atmospheric pressure. Between the interior chamber portion 54 and the exterior chamber portion 64 there is an annular cover 65 sealed on the periphery, above which the gusset plates 66 are situated which lead to adjusting means 67 for the adjustment of the anchor struts 57 inside of the chamber portion 54.

The extremely compact, space-saving construction of the apparatus is apparent especially in FIGS. 5 to 7, especially the fact that the substrate holders do not have to be passed through airlocks to enter the atmosphere.

The invention claimed is:

1. A drive mechanism for a vacuum treatment apparatus, by which a plurality of substrate holders can be transported on a circulation path surrounding an axis (A—A) from an entry airlock through at least one treatment chamber to an exit airlock comprising: a stationary supporting column being disposed in the center of the circulation path and on it a rotatable drive chamber is borne, on the outsides of which control rods are disposed for a rotation and a radial displacement of the substrate holders, a stationary motor being fastened on the supporting column in the rotatable drive chamber and rotatable displacing drives are disposed for the control rods and penetrate one of the walls of the drive chamber and are in working connection each with a corresponding substrate holder, wherein a) the motor is connected with a fixed bearing housing in which a rotatable star-shaped arrangement of cantilevers is mounted concentrically with the supporting column, b) the cantilevers are joined articulately with one end of double-arm bell-crank levers which have each at least one pivot pin, c) the other end of the bell-crank levers is articulated with one end of the control rods, and d) the pivot pins of the bell-crank levers are guided in a first fixed radial cam whose shape determines the radial movements of the control rods.

2. A drive mechanism according to claim 1, wherein the control rods are held in radial guides which are fastened to the rotatable drive chamber.

3. A drive mechanism according to claim 1, wherein the first radial cam is disposed in a stationary control plate underneath the bell-crank levers.

4. A drive mechanism according to claim 1, wherein the bell-crank levers are disposed and configured in a sickle shape and curved radially outward and wherein their pivot pins guided through the first radial cam are disposed in the middle portion of the bell-crank levers.

5. A drive mechanism according to claim 1, wherein the ends of the bell-crank levers remote from the cantilevers are joined by connecting rods to the control rods.

6. A drive mechanism according to claim 1, wherein the first radial cam has a continuous periodically undulating course in the circumferential direction such that by the maximum radial distance of which from the axis (A—A) the end position of the substrate holders can be determined with respect to the particular treatment chamber.

7. A drive mechanism according to claim 1, wherein within the first stationary radial cam a second stationary radial cam is disposed, and wherein on the rotatable star-shaped arrangement of cantilevers at least one swivel joint is disposed on which a bell-crank lever is disposed, whose one end is guided by the second radial cam and whose other end is joined by a link to the drive chamber such that its circumferential speed, superimposed on the radial displacement of the substrate holders, is periodically variable.

8. A drive mechanism according to claim 7, wherein at diametrically opposite points of the star-shaped arrangement of cantilevers, one swivel joint each with one bell-crank lever is disposed, which is connected by a link with the drive chamber.

9. A drive mechanism according to claim 7, wherein the end of the link that faces away from the at least one bell-crank lever is joined by a pivot pin to the drive chamber.

10. A drive mechanism according to claim 9, wherein each pivot pin is joined through a corner piece and a corner block to an adjacent corner of the drive chamber.

11. A drive mechanism according to claim 1, wherein at each of the rotatable cantilevers at least one position transmitter is disposed which is in effective connection with corresponding position receivers.

12. A drive mechanism according to claim 11, wherein by signals of the position transmitter and position receiver both the angular position of all cantilevers as well as the association with one of the treatment chambers as well as with the transfer chamber can be determined.

13. A drive mechanism according to claim 1, wherein four cantilevers, one transfer chamber and three treatment chambers are disposed on the periphery of the axis (A—A) in an equidistant angular distribution.

14. A drive mechanism according to claim 1, wherein the drive mechanism with the drive chamber is disposed between the bottom of an inner chamber portion and the bottom of an outer chamber portion.

15. A drive mechanism according to claim 14, wherein four pairs of horizontal cantilevers are fastened on the drive chamber in a cross arrangement, and on them are suspended parallelogram link arrangements whose bottom ends are joined through additional horizontal cantilevers to the substrate holders.

16. A drive mechanism according to claim 1, wherein the substrate holders are pointed upward toward the axis (A—A) at angles of 3 to 15 degrees.

17. A drive mechanism according to claim 14, wherein a horizontal linear row of airlocks is disposed on the chamber portion in a tangential direction to the axis (A—A) and consists of the entry airlock chamber, the transfer chamber and the exit airlock chamber through which the substrates can be carried at an angle of 3 to 15 degrees.

18. A drive mechanism according to claim 16, wherein a horizontal linear row of airlocks is disposed on the chamber portion in a tangential direction to the axis (A—A) and consists of the entry airlock chamber, the transfer chamber and the exit airlock chamber through which the substrates can be carried at an angle of 3 to 15 degrees.

* * * * *